United States Patent
Ashikaga

(10) Patent No.: US 9,429,601 B2
(45) Date of Patent: Aug. 30, 2016

(54) ALTERNATING CURRENT INPUT VOLTAGE DETECTION CIRCUIT

(71) Applicant: SANKEN ELECTRIC CO., LTD., Niiza-shi, Saitama (JP)

(72) Inventor: Toru Ashikaga, Saitama (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 753 days.

(21) Appl. No.: 13/749,874

(22) Filed: Jan. 25, 2013

(65) Prior Publication Data

US 2013/0253865 A1    Sep. 26, 2013

(30) Foreign Application Priority Data

Mar. 26, 2012    (JP) .................................. 2012-069047

(51) Int. Cl.
| | | |
|---|---|---|
| G01R 19/00 | (2006.01) | |
| G01R 19/02 | (2006.01) | |
| G01R 21/06 | (2006.01) | |
| G06F 17/00 | (2006.01) | |

(52) U.S. Cl.
CPC ........... *G01R 21/06* (2013.01); *G01R 19/0084* (2013.01); *G06F 17/00* (2013.01); *G01R 19/02* (2013.01)

(58) Field of Classification Search
CPC ................................ G01R 21/06; G06F 17/00
See application file for complete search history.

(56) References Cited

U.S. PATENT DOCUMENTS

| | | |
|---|---|---|
| 5,745,233 A | 4/1998 | Asada et al. |
| 7,923,983 B2 | 4/2011 | Fornage |
| 8,299,776 B2 | 10/2012 | Fornage |
| 9,279,832 B2 | 3/2016 | Fornage |
| 2006/0186892 A1 | 8/2006 | Hiramatsu et al. |
| 2009/0243587 A1 | 10/2009 | Fornage |
| 2010/0187914 A1* | 7/2010 | Rada .................... G05F 1/70 307/105 |
| 2011/0169479 A1 | 7/2011 | Fornage |
| 2013/0027025 A1 | 1/2013 | Fornage |

FOREIGN PATENT DOCUMENTS

| | | |
|---|---|---|
| JP | H09211036 A | 8/1997 |
| JP | 11-155284 A | 6/1999 |
| JP | 2003-348849 A | 12/2003 |

(Continued)

OTHER PUBLICATIONS

Feb. 9, 2016—(JP) Notification of Reasons for Refusal—App 2012-069047.

*Primary Examiner* — Regis Betsch
(74) *Attorney, Agent, or Firm* — Banner & Witcoff, Ltd.

(57) ABSTRACT

An alternating current input voltage detection circuit comprises: a first voltage waveform detection circuit that detects a voltage waveform of one alternating current input terminal of the diode rectification circuit, based on a reference potential of the device; a second voltage waveform detection circuit that detects a voltage waveform of the other alternating current input terminal of the diode rectification circuit, based on the reference potential of the device, and a voltage waveform generation circuit that: calculates a first detection voltage waveform, which is output from the first voltage waveform detection circuit, and a second detection voltage waveform, which is output from the second voltage waveform detection circuit; generates a voltage waveform signal, in which waveform distortions generated in the first detection voltage waveform and the second detection voltage waveform are eliminated; and outputs the voltage waveform signal as the voltage detection signal.

4 Claims, 11 Drawing Sheets

(56) References Cited

FOREIGN PATENT DOCUMENTS

| JP | 2005-049278 A | 2/2005 |
| JP | 2008-186592 A | 8/2008 |
| JP | 2010-085231 A | 4/2010 |
| JP | 2011-515702 A | 5/2011 |

* cited by examiner

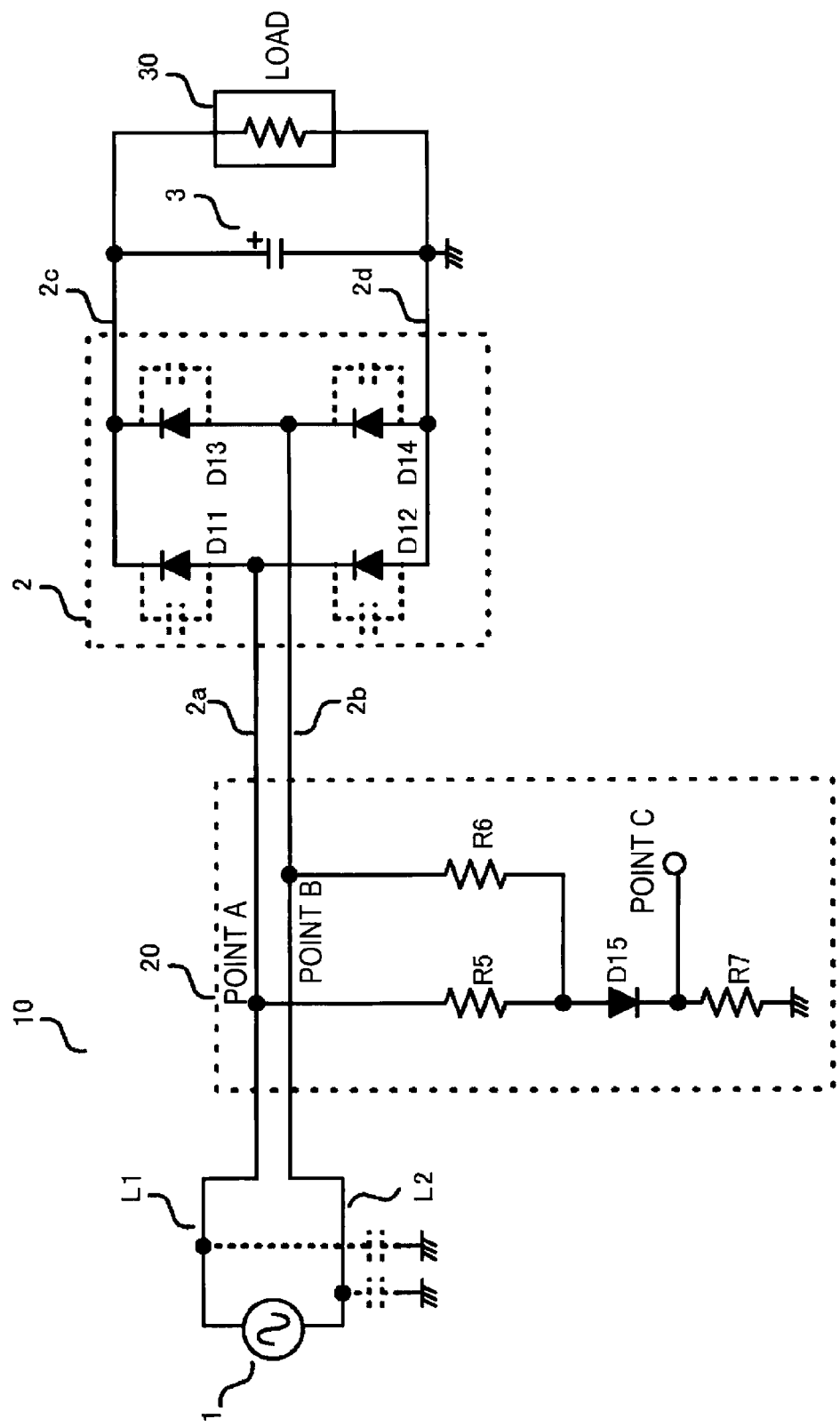
FIG.10 -BACKGROUND ART-

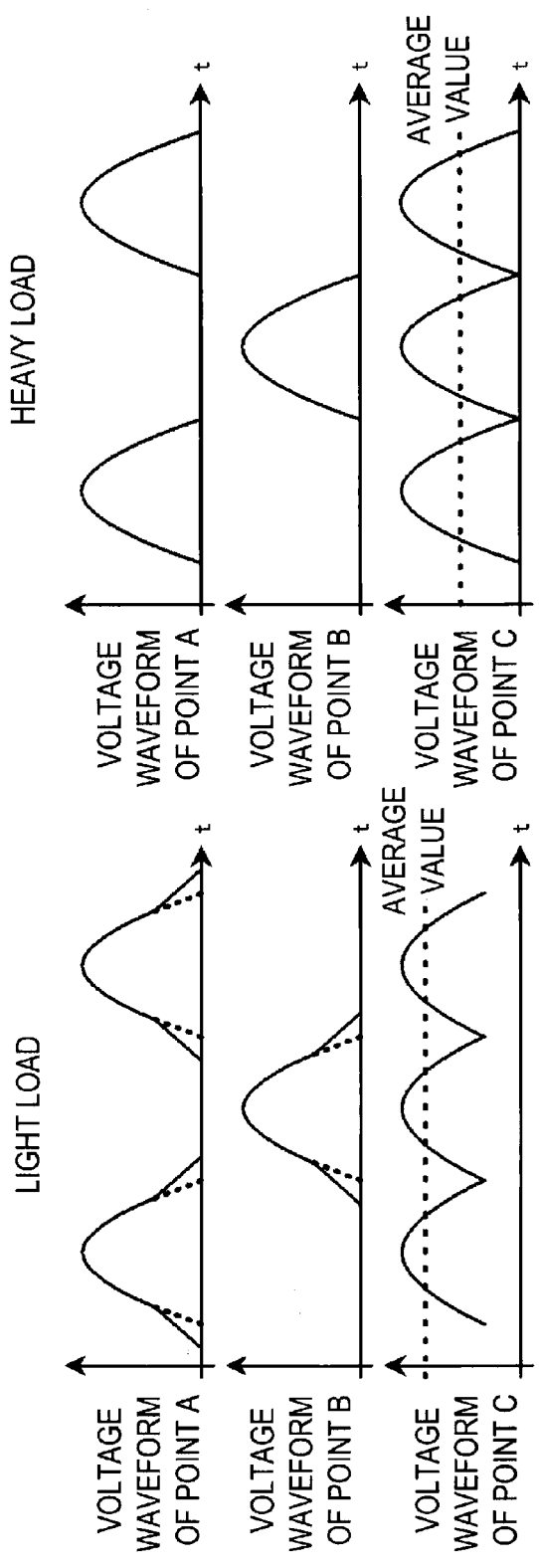
FIG. 11 -BACKGROUND ART-

ALTERNATING CURRENT INPUT VOLTAGE DETECTION CIRCUIT

CROSS-REFERENCE TO RELATED APPLICATION

This application claims priority from Japanese Patent Application No. 2012-069047 filed on Mar. 26, 2012, the entire subject matter of which is incorporated herein by reference.

TECHNICAL FIELD

This disclosure relates to an alternating current input voltage detection circuit of a power supply device and the like having an alternating current power supply as an input source.

BACKGROUND

It is known that a power supply device obtains a direct current power supply based on an alternating current power supply as an input source and an alternating current input voltage detection circuit detects an alternating current input voltage (a voltage of the alternating current power supply) to thus output a voltage detection signal. FIG. 8 illustrates an example of the power supply device and the alternating current input voltage detection circuit of the background art. In FIG. 8, the power supply device 10 has a diode rectification circuit 2 and a smoothing capacitor 3. Also, the alternating current input voltage detection circuit 20 is provided in the power supply device 10.

The diode rectification circuit 2 includes four diodes D11 to D14 that forms a full-wave rectification circuit having a bridge configuration. One alternating current input terminal 2a of the diode rectification circuit 2 is connected to one terminal of an alternating current power supply 1 through an alternating current power supply line L1 and to a connection point of the diode D11 and the diode D12. The other alternating current input terminal 2b of the diode rectification circuit 2 is connected to the other terminal of the alternating current power supply 1 through an alternating current power supply line L2 and to a connection point of the diode D13 and the diode D14. Also, a positive direct current output terminal 2c of the diode rectification circuit 2 is connected to a connection point of the diode D11 and the diode D13 and to one end of the smoothing capacitor 3. A negative direct current output terminal 2d of the diode rectification circuit 2 is connected to a connection point of the diode D12 and the diode D14 and to the other end of the smoothing capacitor 3.

The other end of the smoothing capacitor 3 is grounded and thus becomes a reference potential of the power supply device 10. Also, the smoothing capacitor 3 is connected in parallel with a load 30.

The alternating current input voltage detection circuit 20 includes resistances R5 to R7 and a diode D15. One end of the resistance R5 is connected to the one terminal of the alternating current power supply 1 or one alternating current input terminal 2a of the diode rectification circuit 2, one end of the resistance R6 is connected to the other end of the alternating current power supply 1 or other alternating current input terminal 2b of the diode rectification circuit 2, the other end of the resistance R5 is connected to the other end of the resistance R6 and to an anode of the diode D15, a cathode of the diode D15 is connected to one end of the resistance R7 and the other end of the resistance R7 is grounded. Also, a connection point of the one end of the resistance R5 and the one terminal of the alternating current power supply 1 or a connection point of the one end of the resistance R5 and the one alternating current input terminal 2a of the diode rectification circuit 2 is referred to as a point A, a connection point of the one end of the resistance R6 and the other terminal of the alternating current power supply 1 or a connection point of the one end of the resistance R6 and the other alternating current input terminal 2b of the diode rectification circuit 2 is referred to as a point B, and a connection point of the cathode of the diode D15 and the one end of the resistance R7 is referred to as a point C.

In the below, operations of the power supply device 10 and alternating current input voltage detection circuit 20 configured as described above will be described.

The power supply device 10 full-wave rectifies an alternating current input voltage, which is supplied from the alternating current power supply 1, by the diode rectification circuit 2, smoothes the full-wave rectified voltage by the smoothing capacitor 3 to convert into a direct current output voltage and thus outputs the direct current output voltage to the load 30 that is connected in parallel with the smoothing capacitor 3. Also, a power supply device, in which the smoothing capacitor 3 is replaced with a power conversion unit (not shown) of a boost converter to has a function of improving a power factor of the alternating current power supply 1 and to output a direct current output voltage higher than the alternating current input voltage, and a power supply device, in which a power conversion unit (not shown) such as DC-DC converter and DC-AC converter is provided between the smoothing capacitor 3 (or boost converter) and the load 30 to convert the alternating current input voltage into a desired direct current output voltage or alternating current output voltage and to output the same, have been also known.

The alternating current input voltage detection circuit 20 is a circuit that detects the alternating current input voltage supplied from the alternating current power supply 1 and thus outputs a voltage detection signal, inputs voltage waveforms of the points A and B, on the basis of the reference potential (ground) of the power supply device 10, and outputs a voltage waveform of the point C as the voltage detection signal. The voltage detection signal is output from the alternating current input voltage detection circuit 20 is used to detect a voltage value such as average value and effective value of the alternating current input voltage and is used to detect a zero cross of the alternating current input voltage and to detect an abnormality (outage, voltage lowering, overvoltage and the like) of the alternating current power supply 1, at an inside or outside of the power supply device 10.

Also, for example, JP-A-11-155284 discloses an outage detection circuit, as a related technology of the background art.

SUMMARY

In the meantime, as shown in FIG. 9, during light load and heavy load, when there is no change in the voltage waveform of the point A and also in the voltage waveform of the point B, the voltage waveform of the point C does not change. That is, when the voltage detection signal that is output from the alternating current input voltage detection circuit 20 is not influenced due to the load, according to the voltage detection signal that is output from the alternating input voltage detection circuit 20, it is possible to precisely detect a voltage value such as average value and effective value of the alternating current input voltage, a zero cross of the alternating current input voltage and an abnormality of the alternating current power supply 1.

However, actually, as shown in FIG. 11, during the light load, a waveform distortion is generated in the vicinity of a zero voltage of the voltage waveforms of the points A and B. As shown in FIG. 10, it is thought that the generation of the waveform distortion is influenced by a parasitic capacitance (which is shown with the dotted line) of the alternating current power supply lines L1, L2 or parasitic capacitance (which is shown with the dotted line) of the diode rectification circuit 2, and the like. Since the voltage waveform of the point C is generated by combining the voltage waveform of the point A and the voltage waveform of the point B with the diode D15, the voltage waveform of the point C is increased in the vicinity of the zero voltage due to the waveform distortion. Since the generation of the waveform distortion causes a change in the voltage waveform of the point A and also in the voltage waveform of the point B during the light load and heavy load, a change is caused in the voltage waveform of the point C. That is, since the voltage detection signal that is output from the alternating input voltage detection circuit 20 is influenced due to the load, it is not possible to precisely detect the voltage value such as average value and effective value of the alternating current input voltage, the zero cross of the alternating current input voltage and the abnormality of the alternating current power supply 1 from the voltage detection signal. As can be also seen from FIG. 11, an average value of the alternating current input voltage during the light load is detected to be larger than an average value of the alternating current input voltage during the heavy load.

Like this, since the waveform distortion is caused in the voltage detection signal that is output from the alternating input voltage detection circuit 20, it is not possible to precisely detect the voltage value such as average value and effective value of the alternating current input voltage, the zero cross of the alternating current input voltage and the abnormality of the alternating current power supply 1, from the voltage detection signal having the waveform distortion, at the inside or outside of the power supply device 10.

In view of the above, this disclosure provides at least an alternating current input voltage detection circuit that detects an alternating current input voltage supplied from an alternating current power supply and thus outputs a voltage detection signal without waveform distortion.

An alternating current input voltage detection circuit of this disclosure is provided at an inside or outside of a device rectifying an alternating current input voltage supplied from an alternating current power supply by a diode rectification circuit having a bridge configuration to detect the alternating current input voltage and output a voltage detection signal. The alternating current input voltage detection circuit comprises; a first voltage waveform detection circuit that detects a voltage waveform of one alternating current input terminal of the diode rectification circuit, based on a reference potential of the device; a second voltage waveform detection circuit that detects a voltage waveform of the other alternating current input terminal of the diode rectification circuit, based on the reference potential of the device, and a voltage waveform generation circuit that: calculates a first detection voltage waveform, which is output from the first voltage waveform detection circuit, and a second detection voltage waveform, which is output from the second voltage waveform detection circuit; generates a voltage waveform signal, in which waveform distortions generated in the first detection voltage waveform and the second detection voltage waveform are eliminated; and outputs the voltage waveform signal as the voltage detection signal.

According to this disclosure, it is possible to provide the alternating current input voltage detection circuit that detects the alternating current input voltage supplied from the alternating current power supply and thus outputs the voltage detection signal without waveform distortion.

BRIEF DESCRIPTION OF THE DRAWINGS

The foregoing and additional features and characteristics of this disclosure will become more apparent from the following detailed descriptions considered with the reference to the accompanying drawings, wherein:

FIG. 10 illustrates the power supply device of FIG. 8 in which a parasitic capacitance is applied; and FIG. 11 illustrates waveforms of respective units of the alternating current input voltage detection circuit shown in FIG. 10.

DETAILED DESCRIPTION

Figure 1:
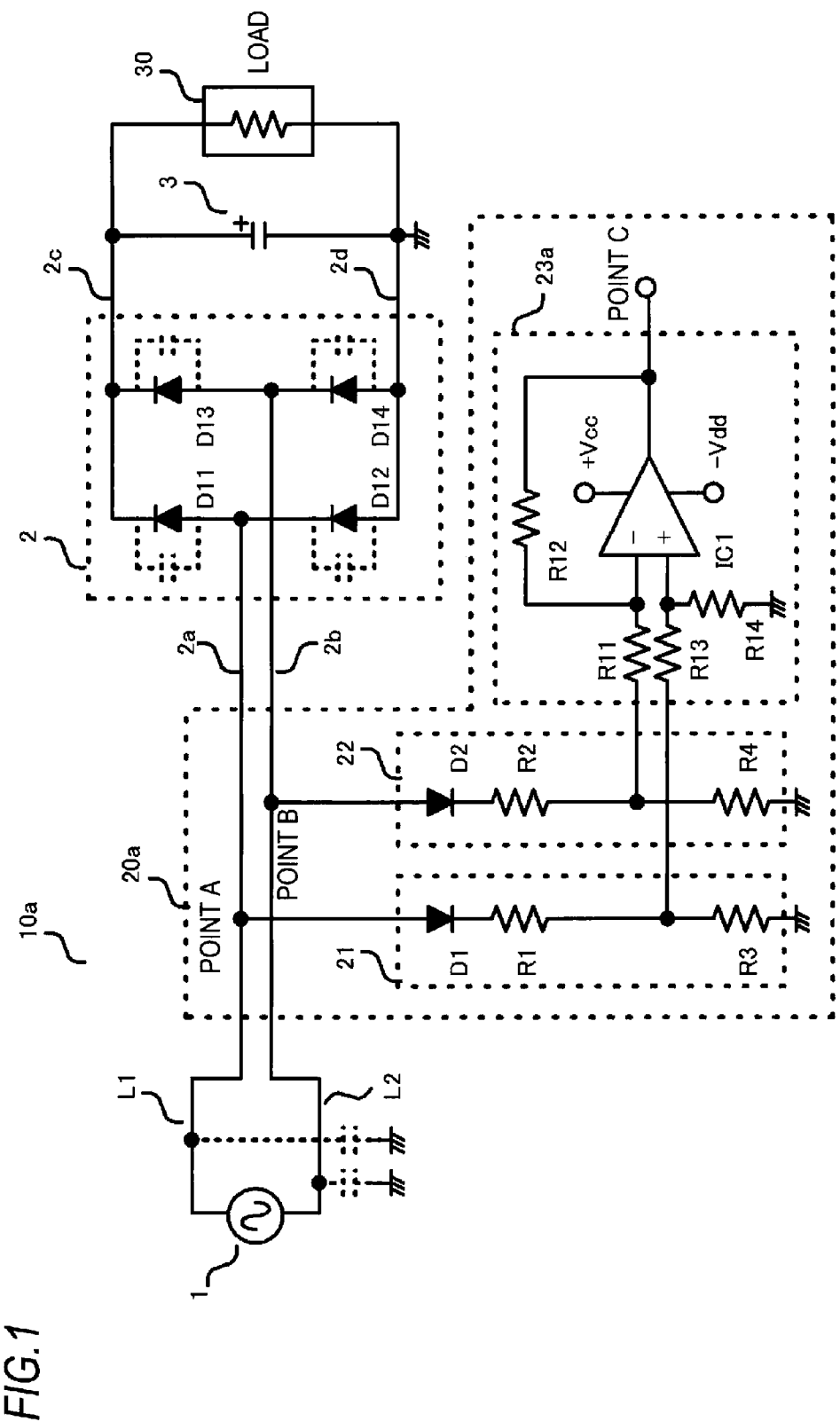
FIG. 1 illustrates an alternating current input voltage detection circuit according to a first illustrative embodiment of this disclosure.

Hereinafter, illustrative embodiments, in which this disclosure is applied to an alternating current input voltage detection circuit of a power supply device having an alternating current power supply as an input source, will be described with reference to the drawings. Also, in the respective drawings, the same parts are indicated with the same reference numerals, and the overlapping descriptions will be omitted.

[First Illustrative Embodiment]

FIG. 1 illustrates an alternating current input voltage detection circuit according to a first illustrative embodiment of this disclosure. In FIG. 1, a power supply device 10a has a diode rectification circuit 2 and a smoothing capacitor 3. Also, an alternating current input voltage detection circuit 20a is provided in the power supply device 10a. Therefore, the power supply device 10a is a device, in which the alternating current input voltage detection circuit 20 of the power supply device 10 shown in FIG. 10 is replaced with the alternating current input voltage detection circuit 20a. Since the other configurations are the same as those shown in FIG. 10, the same parts are indicated with the same reference numerals, and the descriptions thereof will be omitted. Here, only the alternating current input voltage detection circuit 20a will be described. The alternating current input voltage detection circuit 20a has a first voltage waveform detection circuit 21, a second voltage waveform detection circuit 22 and a voltage waveform generation circuit 23a. Also, the alternating current input voltage detection circuit 20a may be provided at an outside of the power supply device 10a.

The first voltage waveform detection circuit 21 includes a diode D1 and resistances R1, R3. An anode of the diode D1 is connected to one terminal of an alternating current power supply 1 and one alternating current input terminal 2a of the diode rectification circuit 2, a cathode of the diode D1 is connected to one end of the resistance R1, the other end of the resistance R1 is connected to one end of the resistance R3 and the other end of the resistance R3 is grounded. Also, a connection point of the anode of the diode D1 and the one terminal of the alternating current power supply 1 or a connection point of the anode of the diode D1 and the one alternating current input terminal 2a of the diode rectification circuit 2 is referred to as a point A.

The second voltage waveform detection circuit 22 includes a diode D2 and resistances R2, R4. An anode of the diode D2 is connected to the other terminal of the alternating current power supply 1 and the other alternating current input terminal 2b of the diode rectification circuit 2, a cathode of the diode D2 is connected to one end of the resistance R2, the other end of the resistance R2 is connected to one end of the resistance R4 and the other end of the resistance R4 is grounded. Also, a connection point of the anode of the diode D1 and the other terminal of the alternating current power supply 1 or a connection point of the anode of the diode D1 and the other alternating current input terminal 2b of the diode rectification circuit 2 is referred to as a point B.

The voltage waveform generation circuit 23a is configured as a subtraction circuit including resistances R11 to R14 and an operational amplifier (which is also referred to as dual power supply operational amplifier) IC1 operating with both power supplies (+Vcc, −Vdd). An output voltage range of the subtraction circuit is −Vdd to +Vcc. An inverting input terminal (−) of the operational amplifier IC1 is connected to a connection point of the resistance R2 and the resistance R4 via the resistance R11 and is connected to an output terminal of the operational amplifier IC1 via the resistance R12. Also, a non-inverting input terminal (+) of the operational amplifier IC1 is connected to a connection point of the resistance R1 and the resistance R3 via the resistance R13 and is connected to a ground via the resistance R14. Also, the output terminal of the operational amplifier IC1 is referred to as a point C.

Next, operations of the alternating current input voltage detection circuit according to the first illustrative embodiment of this disclosure will be described with reference to FIG. 2.

Figure 2:
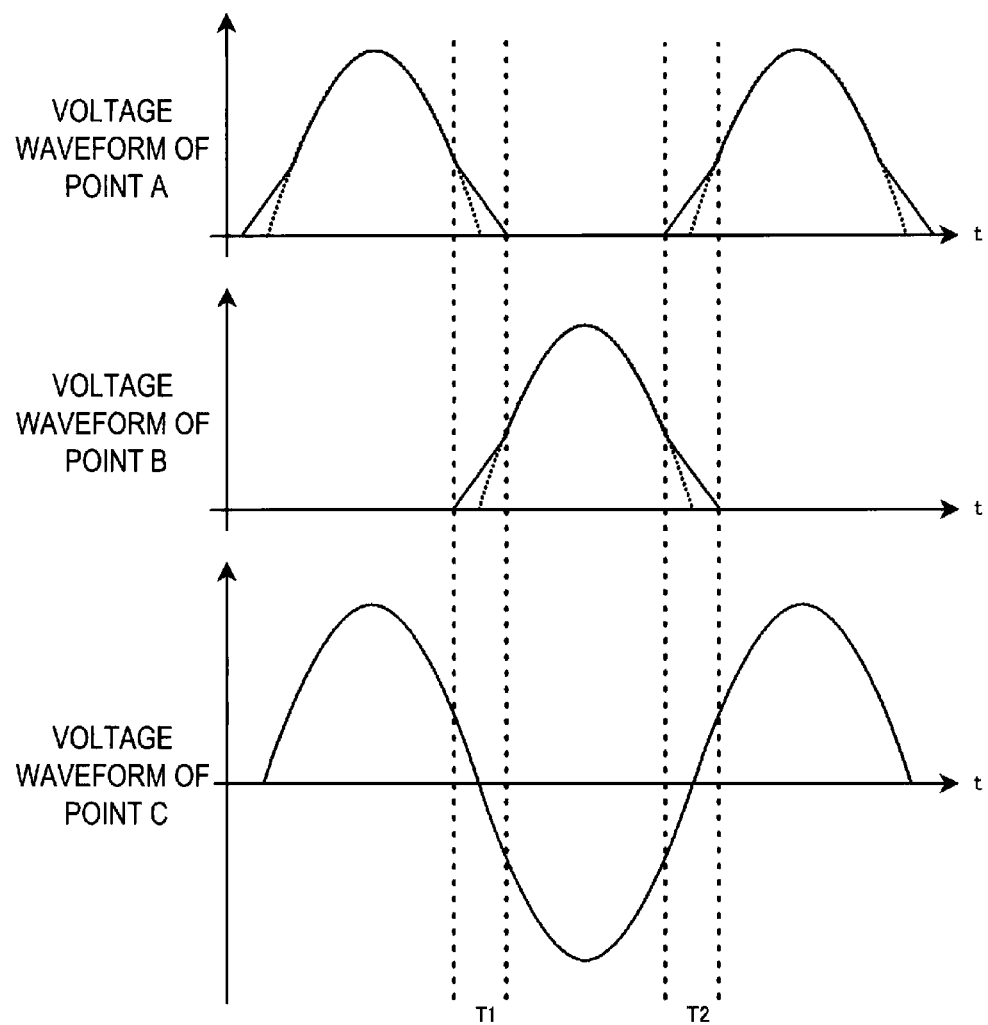
FIG. 2 illustrates waveforms of respective units of the alternating current input voltage detection circuit shown in FIG. 1.

In FIG. 2, time periods T1, T2 indicate the vicinity of the zero voltages of the voltage waveforms of the points A, B. Also, in the time periods T1, T2, a solid waveform indicates voltage when a waveform distortion is caused, and a dotted line waveform indicates voltage when a waveform distortion is not caused. In this illustrative embodiment, in view of amounts of the generation of waveform distortion in the time periods T1, T2 are substantially the same at the points A, B, the waveform distortion is eliminated by calculating the voltage waveforms of the points A, B. Since the waveform distortion is eliminated by the calculation, the voltage waveform of the point C becomes a waveform of a sinusoidal wave shape without waveform distortion.

The first voltage waveform detection circuit 21 inputs the voltage waveform of the point A, on the basis of a reference potential (ground) of the power supply device 10a, and outputs a voltage waveform of one end of the resistance R3 as a first detection voltage waveform.

The second voltage waveform detection circuit 22 inputs the voltage waveform of the point B, on the basis of the reference potential (ground) of the power supply device 10a, and outputs a voltage waveform of one end of the resistance R4 as a second detection voltage waveform.

The voltage waveform generation circuit 23a receives the first detection voltage waveform, which is output from the first voltage waveform detection circuit 21, and the second detection voltage waveform, which is output from the second voltage waveform detection circuit 22, and subtracts the second detection voltage waveform from the first detection voltage waveform. Since the waveform distortions in the vicinity of the zero voltage, which are generated in the first detection voltage waveform and the second detection voltage waveform, are eliminated by the subtraction, they are not output to the point C. The voltage waveform of the point C becomes an alternating current waveform of a sinusoidal wave shape without waveform distortion. That is, the waveform distortion is not generated in the voltage detection signal that is output from the voltage waveform generation circuit 23a.

According to the alternating current input voltage detection circuit of the first illustrative embodiment of this disclosure, it is possible to detect the alternating current input voltage, which is supplied from the alternating current power supply 1, and to output the voltage detection signal without waveform distortion. Therefore, it is possible to precisely detect a voltage value such as average value and effective value of the alternating current input voltage, a zero cross of the alternating current input voltage and an abnormality of the alternating current power supply 1 from the voltage detection signal without waveform distortion, at an inside or outside of the power supply device 10a.

[Second Illustrative Embodiment]

Figure 3:
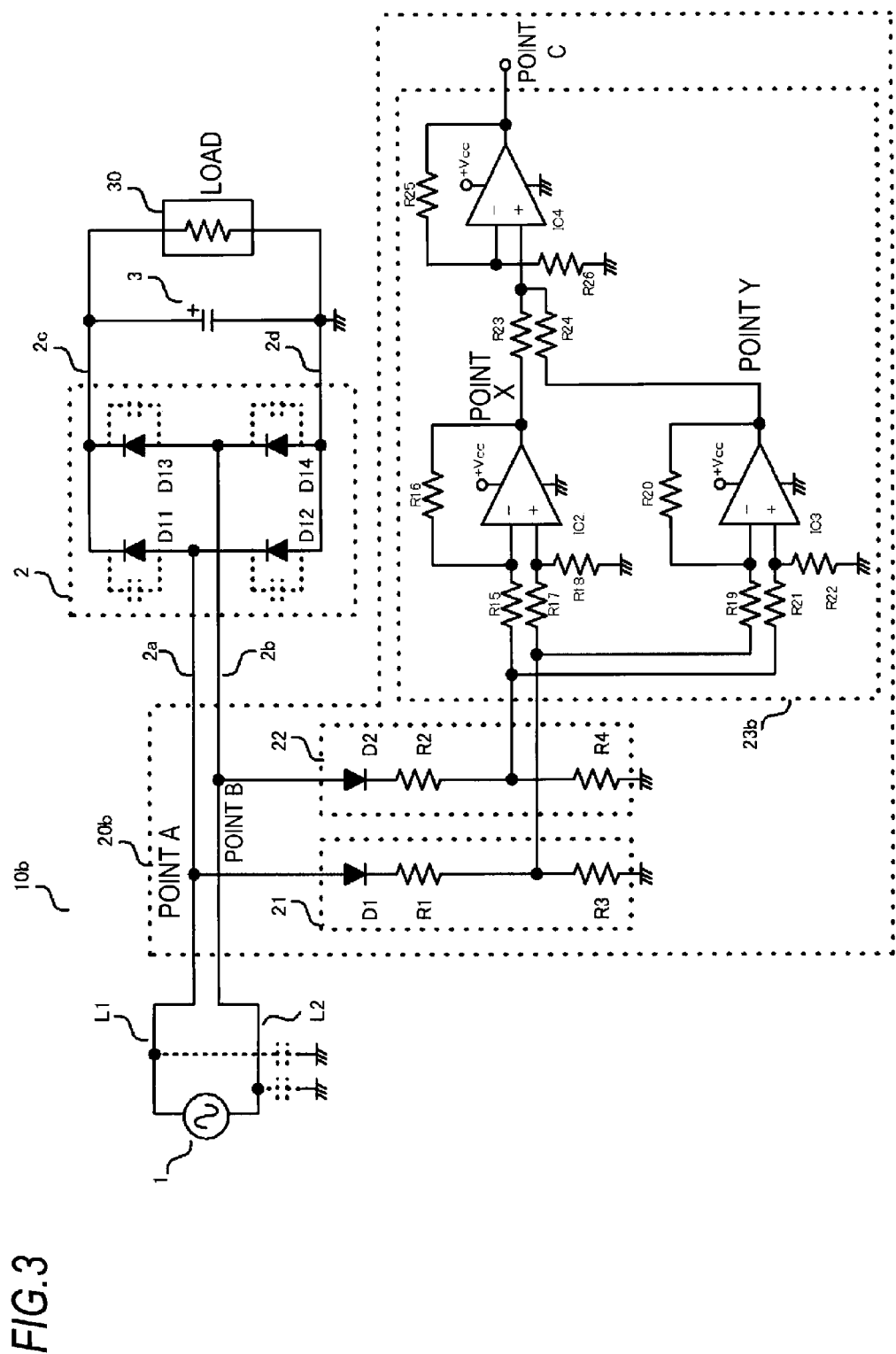
FIG. 3 illustrates an alternating current input voltage detection circuit according to a second illustrative embodiment of this disclosure.

FIG. 3 illustrates an alternating current input voltage detection circuit according to a second illustrative embodiment of this disclosure. In FIG. 3, a power supply device 10b has the diode rectification circuit 2 and the smoothing capacitor 3. Also, an alternating current input voltage detection circuit 20b is provided in the power supply device 10b. Therefore, the power supply device 10b is a device, in which the alternating current input voltage detection circuit 20a of the power supply device 10a shown in FIG. 1 is replaced with the alternating current input voltage detection circuit 20b. Since the other configurations are the same as those shown in FIG. 1, the same parts are indicated with the same reference numerals and the descriptions thereof will be omitted. Here, only the alternating current input voltage detection circuit 20b will be described. The alternating current input voltage detection circuit 20b has the first voltage waveform detection circuit 21, the second voltage waveform detection circuit 22 and a voltage waveform generation circuit 23b. Also, the alternating current input voltage detection circuit 20b may be provided at an outside of the power supply device 10b.

The voltage waveform generation circuit 23b has a first subtraction circuit including resistances R15 to R18 and an operational amplifier (which is also referred to as single power supply operational amplifier) IC2 operating with a single power supply (+Vcc), a second subtraction circuit including resistances R19 to R22 and an operational amplifier IC3 operating with a single power supply (+Vcc), and a first adding circuit including resistances R23 to R26 and an operational amplifier IC4 operating with a single power supply (+Vcc). Output voltage ranges of the first subtraction circuit, the second subtraction circuit and the first adding circuit are 0 to +Vcc.

An inverting input terminal (−) of the operational amplifier IC2 is connected to a connection point of the resistance R2 and the resistance R4 via the resistance R15 and is connected to an output terminal of the operational amplifier IC2 via the resistance R16. Also, a non-inverting input terminal (+) of the operational amplifier IC2 is connected to a connection point of the resistance R1 and the resistance R3 via the resistance R17 and is connected to a ground via the resistance R18. Also, the output terminal of the operational amplifier IC2 is referred to as a point X.

An inverting input terminal (−) of the operational amplifier IC3 is connected to a connection point of the resistance R1 and the resistance R3 via the resistance R19 and is connected to an output terminal of the operational amplifier IC3 via the resistance R20. Also, a non-inverting input terminal (+) of the operational amplifier IC3 is connected to a connection point of the resistance R2 and the resistance R4 via the resistance R21 and is connected to a ground via the resistance R22. Also, the output terminal of the operational amplifier IC3 is referred to as a point Y.

An inverting input terminal (−) of the operational amplifier IC4 is connected to a ground via the resistance 26 and is connected to an output terminal of the operational amplifier IC4 via the resistance R25. Also, a non-inverting input terminal (+) of the operational amplifier IC4 is connected to the output terminal of the operational amplifier IC2 via the resistance R23 and is connected to the output terminal of the operational amplifier IC3 via the resistance R24. Also, the output terminal of the operational amplifier IC4 is referred to as a point C.

Figure 4:
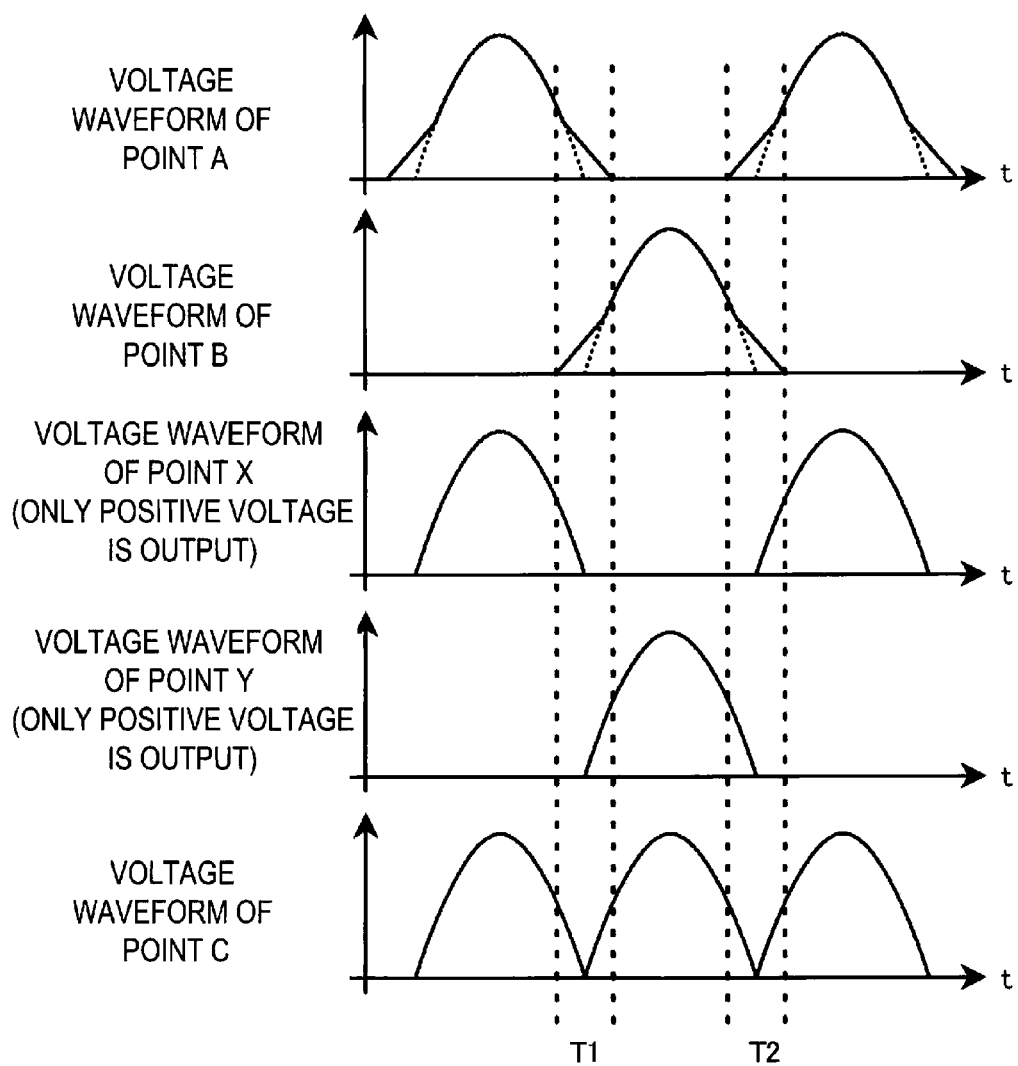
FIG. 4 illustrates waveforms of respective units of the alternating current input voltage detection circuit shown in FIG. 3.

In the below, operations of the alternating current input voltage detection circuit according to the second illustrative embodiment of this disclosure are described also with reference to FIG. 4.

The voltage waveform generation circuit 23b receives the first detection voltage waveform, which is output from the first voltage waveform detection circuit 21, and the second detection voltage waveform, which is output from the second voltage waveform detection circuit 22, then subtracts the second detection voltage waveform from the first detection voltage waveform with the first subtraction circuit, subtracts the first detection voltage waveform from the second detection voltage waveform with the second subtraction circuit, and thus adds an output (voltage waveform of the point X) from the first subtraction circuit and an output (voltage waveform of the point Y) from the second subtraction circuit with the first adding circuit. Since the waveform distortions in the vicinity of the zero voltage, which are generated in the first detection voltage waveform and the second detection voltage waveform, are eliminated by the subtraction, they are not output to the points X, Y. The voltage waveform of the point C becomes a full-wave rectified waveform of a sinusoidal wave shape without waveform distortion. That is, the waveform distortion is not generated in the voltage detection signal that is output from the voltage waveform generation circuit 23b.

Accordingly, even in the alternating current input voltage detection circuit according to the second illustrative embodiment of this disclosure, it is possible to obtain the same effects as those of the alternating current input voltage detection circuit according to the first illustrative embodiment of this disclosure.

[Third Illustrative Embodiment]

Figure 5:
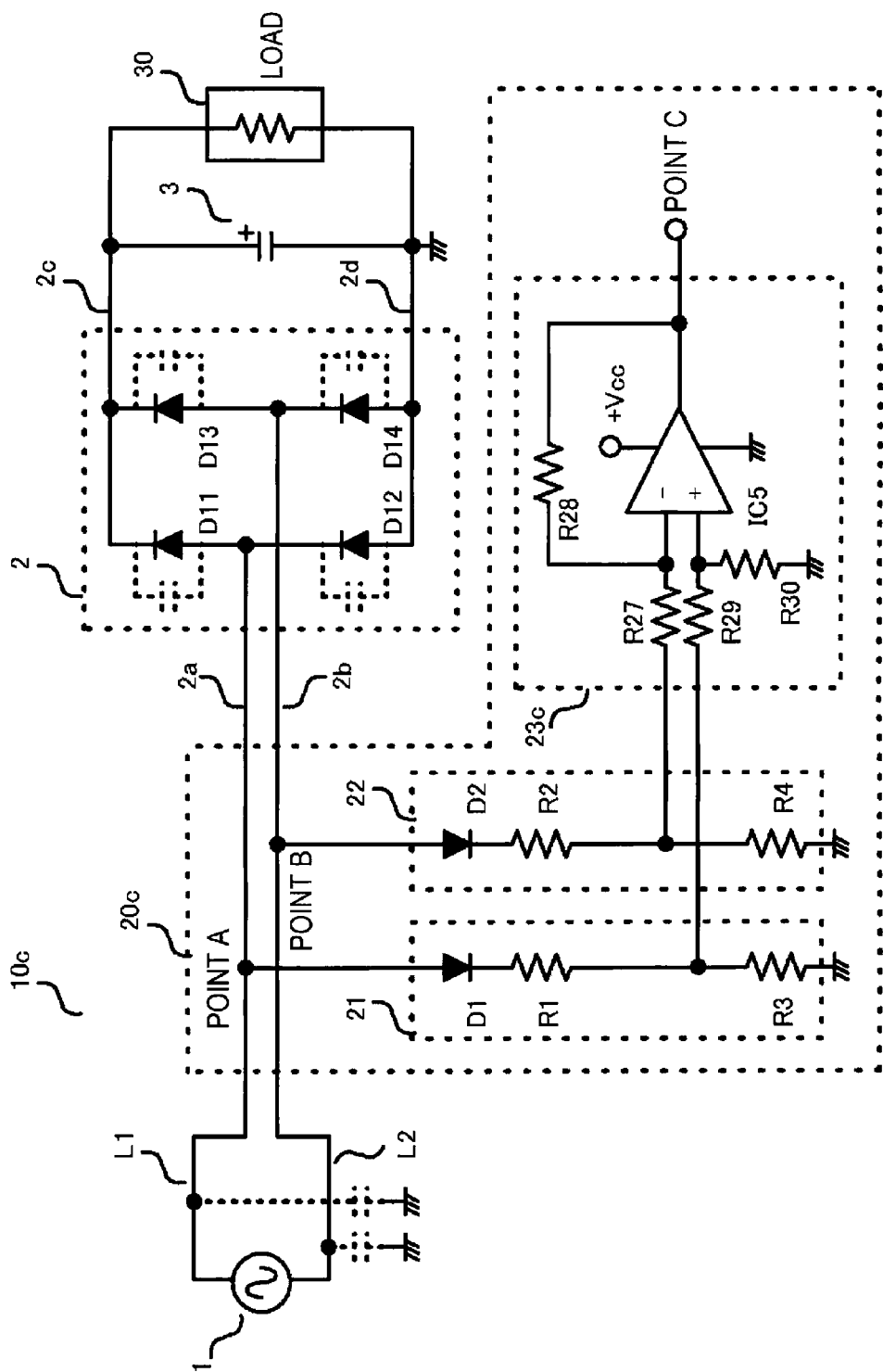
FIG. 5 illustrates an alternating current input voltage detection circuit according to a third illustrative embodiment of this disclosure.

FIG. 5 illustrates an alternating current input voltage detection circuit according to a third illustrative embodiment of this disclosure. In FIG. 5, a power supply device 10c has the diode rectification circuit 2 and the smoothing capacitor 3. Also, an alternating current input voltage detection circuit 20c is provided in the power supply device 10c. Therefore, the power supply device 10c is a device, in which the alternating current input voltage detection circuit 20a of the power supply device 10a shown in FIG. 1 is replaced with the alternating current input voltage detection circuit 20c. Since the other configurations are the same as those shown in FIG. 1, the same parts are indicated with the same reference numerals and the descriptions thereof will be omitted. Here, only the alternating current input voltage detection circuit 20c will be described. The alternating current input voltage detection circuit 20c has the first voltage waveform detection circuit 21, the second voltage waveform detection circuit 22 and a voltage waveform generation circuit 23c. The alternating current input voltage detection circuit 20c may be provided at an outside of the power supply device 10c.

The voltage waveform generation circuit 23c is configured as a subtraction circuit including resistances R27 to R30 and an operational amplifier IC5 operating with a single power supply (+Vcc). An output voltage range of the subtraction circuit is 0 to +Vcc. An inverting input terminal (−) of the operational amplifier IC5 is connected to a connection point of the resistance R2 and the resistance R4 via the resistance R27 and is connected to an output terminal of the operational amplifier IC5 via the resistance R28. Also, a non-inverting input terminal (+) of the operational amplifier IC5 is connected to a connection point of the resistance R1 and the resistance R3 via the resistance R29 and is connected to a ground via the resistance R30. Also, the output terminal of the operational amplifier IC5 is referred to as a point C.

Figure 6:
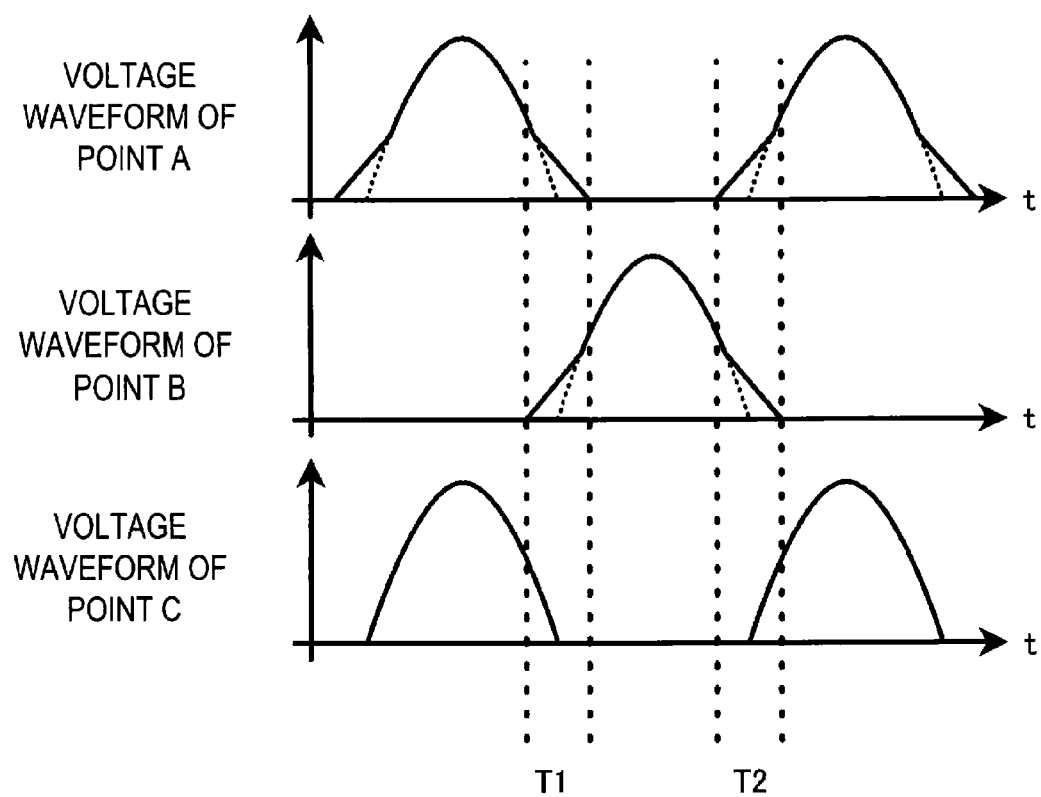
FIG. 6 illustrates waveforms of respective units of the alternating current input voltage detection circuit shown in FIG. 5.

In the below, operations of the alternating current input voltage detection circuit according to the third illustrative embodiment of this disclosure are described also with reference to FIG. 6.

The voltage waveform generation circuit 23c inputs the first detection voltage waveform, which is output from the first voltage waveform detection circuit 21, and the second detection voltage waveform, which is output from the second voltage waveform detection circuit 22, and subtracts the second detection voltage waveform from the first detection voltage waveform. Since the waveform distortions in the vicinity of the zero voltage, which are generated in the first detection voltage waveform and the second detection voltage waveform, are eliminated by the subtraction, they are not output to the point C. The voltage waveform of the point C becomes a half-wave rectified waveform of a sinusoidal wave shape without waveform distortion. That is, the waveform distortion is not generated in the voltage detection signal that is output from the voltage waveform generation circuit 23c.

Accordingly, even in the alternating current input voltage detection circuit according to the third illustrative embodiment of this disclosure, it is possible to obtain the same effects as those of the alternating current input voltage detection circuit according to the first illustrative embodiment of this disclosure.

[Fourth Illustrative Embodiment]

Figure 7:
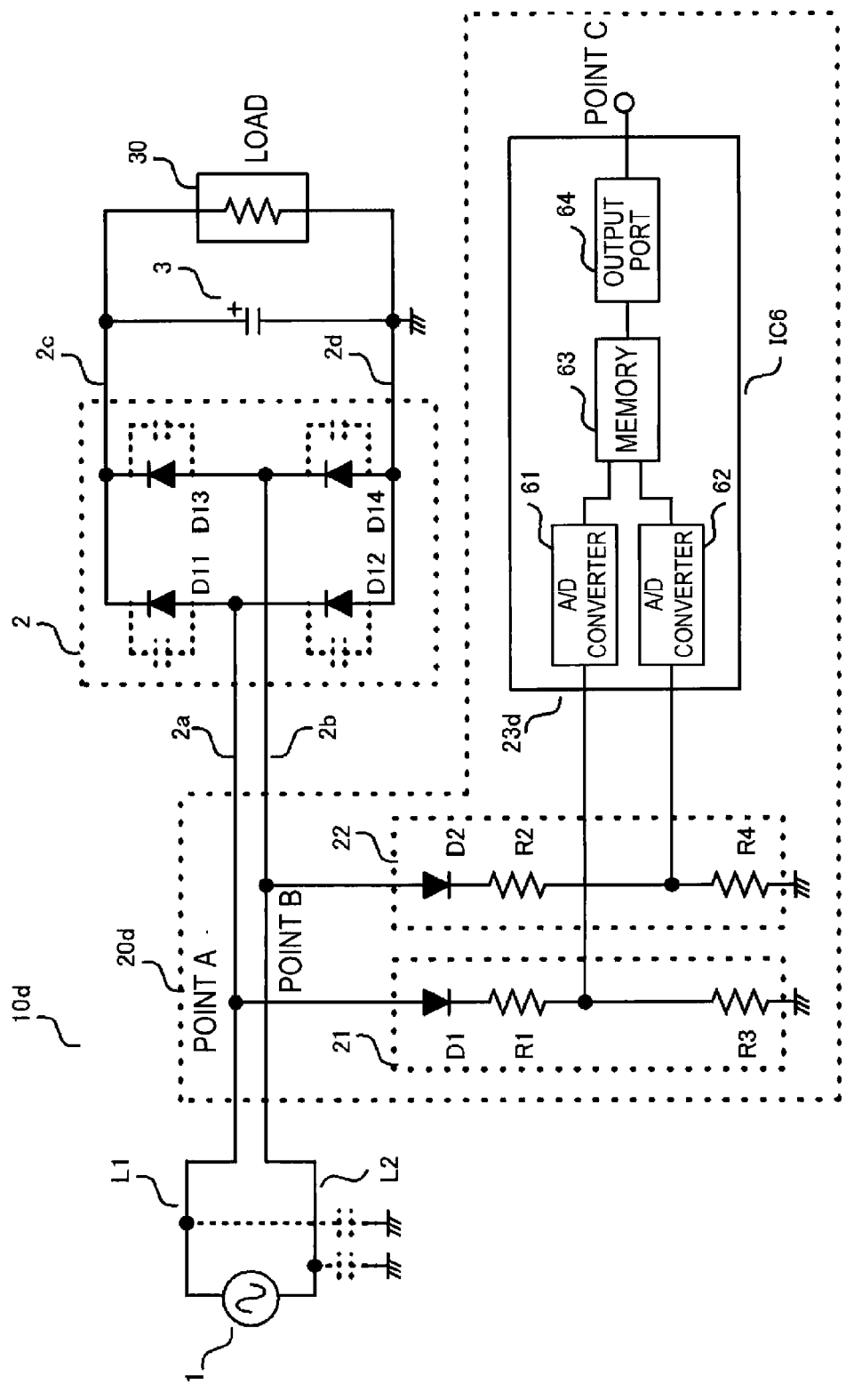
FIG. 7 illustrates an alternating current input voltage detection circuit according to a fourth illustrative embodiment of this disclosure.
Figure 8:
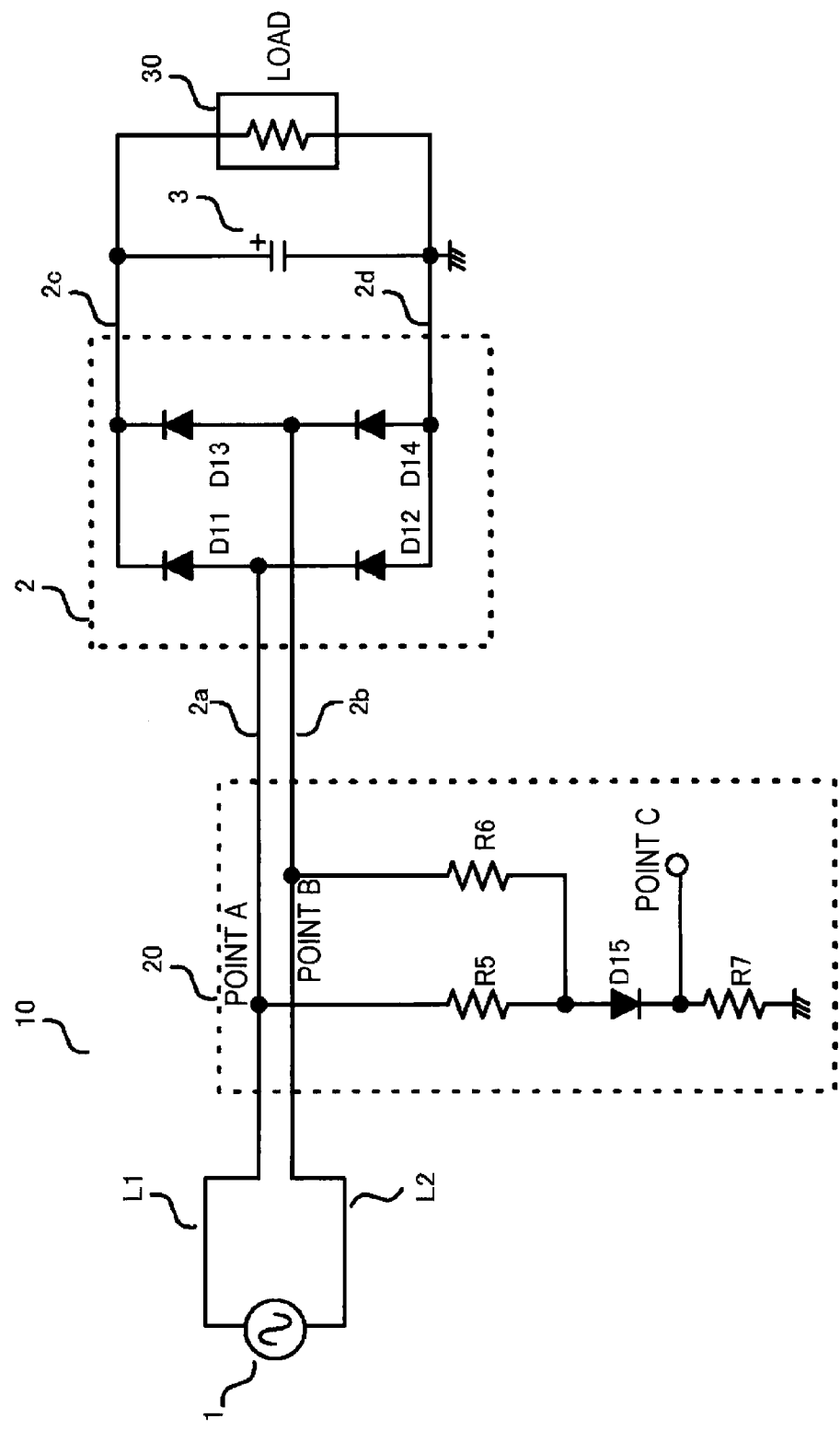
FIG. 8 illustrates an example of a power supply device and an alternating current input voltage detection circuit of the background art.
Figure 9:
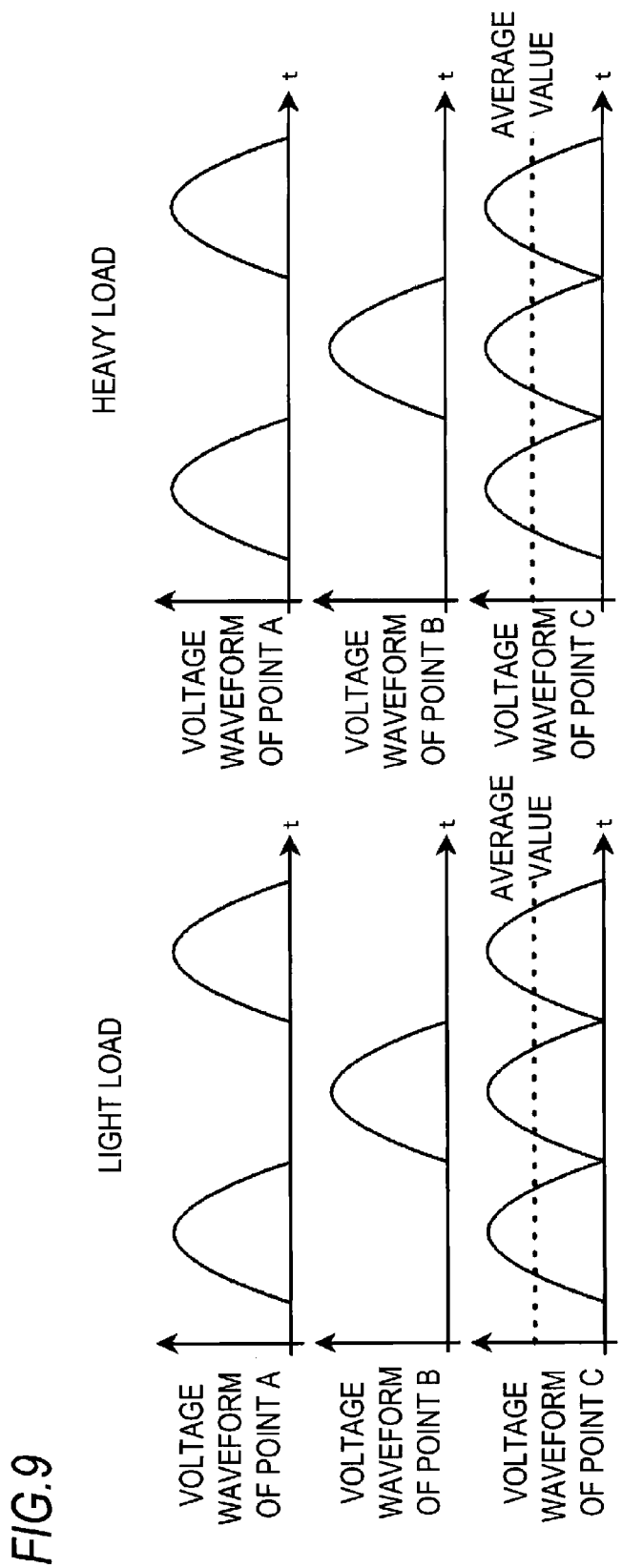
FIG. 9 illustrates waveforms of respective units of the alternating current input voltage detection circuit shown in FIG. 8.

FIG. 7 illustrates an alternating current input voltage detection circuit according to a fourth illustrative embodiment of this disclosure. In FIG. 7, a power supply device 10d has the diode rectification circuit 2 and the smoothing capacitor 3. Also, an alternating current input voltage detection circuit 20d is provided in the power supply device 10d. Therefore, the power supply device 10d is a device, in which the alternating current input voltage detection circuit 20a of the power supply device 10a shown in FIG. 1 is replaced with the alternating current input voltage detection circuit 20d. Since the other configurations are the same as those shown in FIG. 1, the same parts are indicated with the same reference numerals and the descriptions thereof will be omitted. Here, only the alternating current input voltage detection circuit 20d will be described. The alternating current input voltage detection circuit 20d has the first voltage waveform detection circuit 21, the second voltage waveform detection circuit 22 and a voltage waveform generation circuit 23d. Also, the alternating current input voltage detection circuit 20d may be provided at an outside of the power supply device 10d.

The voltage waveform generation circuit 23d includes a microcomputer IC6 having A/D (analog/digital) converters 61, 62, a memory 63 and an output port 64. The A/D converter 61 of the microcomputer IC6 is connected to a connection point of the resistance R1 and the resistance R3. Also, the A/D converter 62 of the microcomputer IC6 is connected to a connection point of the resistance R2 and the resistance R4. The memory 63 is connected to the A/D converters 61, 62 and to the output port 64. Also, an output terminal of the output port 64 the microcomputer IC6 is referred to as a point C.

In the below, operations of the alternating current input voltage detection circuit according to the fourth illustrative embodiment of this disclosure are described.

The voltage waveform generation circuit 23d inputs the first detection voltage waveform, which is output from the first voltage waveform detection circuit 21, and the second detection voltage waveform, which is output from the second voltage waveform detection circuit 22, samples the first detection voltage waveform by the A/D converter 61 and the second detection voltage waveform by the A/D converter 62 every predetermined period to thus convert the same into digital signals and stores the converted digital signals in the memory 63, subtracts the second detection voltage waveform from the first detection voltage waveform, as digital processing (calculation function of the microcomputer), and stores the result of the subtraction in the memory 63. The voltage waveform that is obtained by the subtraction of the digital processing is output from the output terminal of the output port 64. Since the waveform distortions in the vicinity of the zero voltage, which are generated in the first detection voltage waveform and the second detection voltage waveform, are eliminated by the subtraction of the digital processing, they are not output to the point C. The voltage waveform of the point C becomes a half-wave rectified waveform of a sinusoidal wave shape without waveform distortion. That is, the waveform distortion is not generated in the voltage detection signal that is output from the voltage waveform generation circuit 23d.

Accordingly, even in the alternating current input voltage detection circuit according to the fourth illustrative embodiment of this disclosure, it is possible to obtain the same effects as those of the alternating current input voltage detection circuit according to the first illustrative embodiment of this disclosure.

Also, this disclosure is not limited to the above illustrative embodiments. In the illustrative embodiments of this disclosure, the voltage waveform is output as the voltage detection signal. However, a voltage value such as average value and effective value may be generated from the voltage waveform by a well-known technology (which is not shown and described here) and the voltage waveform and voltage value may be output as the voltage detection signal. Also, the diodes D1, D2 may be omitted.

Also, in the illustrative embodiments of this disclosure, the negative direct current output terminal 2d of the diode rectification circuit 2 or the other end of the smoothing capacitor 3 is grounded and is thus set to be the reference potential of the power supply device 10a to 10d. However, in a power supply device having a boost converter, a DC-DC converter, a DC-AC converter and the like, one end of a current detector may be connected to the negative direct current output terminal 2d of the diode rectification circuit 2. In this power supply device, the other end of the current detector may be grounded and thus set to be the reference potential.

The alternating current input voltage detection circuit of this disclosure can be applied to a variety of power supply devices or control devices in which an alternating current input voltage supplied from an alternating current power supply is rectified by a diode rectification circuit having a bridge configuration.

What is claimed is:

1. An alternating current input voltage detection circuit that is provided at an inside or outside of a device rectifying an alternating current input voltage supplied from an alternating current power supply by a diode rectification circuit having a bridge configuration to detect the alternating current input voltage and output a voltage detection signal, the alternating current input voltage detection circuit comprising:

a first voltage waveform detection circuit that detects a voltage waveform of one alternating current input terminal of the diode rectification circuit, based on a ground potential corresponding to a negative direct current output of the device, wherein a first detection voltage waveform is output from the first voltage waveform detection circuit;

a second voltage waveform detection circuit that detects a voltage waveform of the other alternating current input terminal of the diode rectification circuit, based on the ground potential corresponding to a negative direct current output of the device, wherein a second detection voltage waveform is output from the second voltage waveform detection circuit;

a first subtraction circuit that subtracts the second detection voltage waveform from the first detection voltage waveform and generates a first detection voltage waveform signal, in which waveform distortions generated in the vicinity of a zero voltage of the first detection voltage waveform and the second detection voltage waveform are eliminated;

a second subtraction circuit that subtracts the first detection voltage waveform from the second detection voltage waveform and generates a second detection voltage waveform signal, in which waveform distortions generated in the vicinity of a zero voltage of the first detection voltage waveform and the second detection voltage waveform are eliminated;

a first adding circuit that adds an output from the first subtraction circuit and an output from the second subtraction circuit; and a voltage waveform generation circuit that:
  outputs a voltage waveform signal from the first adding circuit as the voltage detection signal.

2. The alternating current input voltage detection circuit according to claim 1,
  wherein the voltage waveform generation circuit includes: a microcomputer having an A/D converter, a memory and an output port, and
  wherein the voltage waveform generation circuit subtracts the first detection voltage waveform and the second detection voltage waveform by a calculation function of the microcomputer.

3. The alternating current input voltage detection circuit according to claim 1,
  wherein the voltage detection signal that is output from the voltage waveform generation circuit includes at least one of a voltage value of an average value and effective value.

4. The alternating current input voltage detection circuit according to claim 1,
  wherein the first voltage waveform detection circuit and the second voltage waveform detection circuit have the same configuration,
  wherein the first voltage waveform detection circuit is connected between one alternating current input terminal of the diode rectification circuit and a ground becoming the reference potential of the device, and
  wherein the second voltage waveform detection circuit is connected between the other alternating current input terminal of the diode rectification circuit and the ground becoming the reference potential of the device.

* * * * *